US007860843B2

(12) United States Patent
Dodd et al.

(10) Patent No.: US 7,860,843 B2
(45) Date of Patent: Dec. 28, 2010

(54) DATA COMPRESSION AND STORAGE TECHNIQUES

(75) Inventors: Brian Dodd, Longmont, CO (US); Michael Moore, Lafayette, CO (US)

(73) Assignee: Data Storage Group, Inc., Longmont, CO (US)

( * ) Notice: Subject to any disclaimer, the term of this patent is extended or adjusted under 35 U.S.C. 154(b) by 0 days.

(21) Appl. No.: 11/733,086

(22) Filed: Apr. 9, 2007

(65) Prior Publication Data
US 2008/0034268 A1 Feb. 7, 2008

Related U.S. Application Data

(60) Provisional application No. 60/744,477, filed on Apr. 7, 2006.

(51) Int. Cl.
G06F 17/30 (2006.01)
(52) U.S. Cl. ........................ 707/693; 707/698
(58) Field of Classification Search ................ None
See application file for complete search history.

(56) References Cited

U.S. PATENT DOCUMENTS

| 5,574,906 | A | * | 11/1996 | Morris ........................ 707/1 |
| 5,990,810 | A | | 11/1999 | Williams |
| 6,374,250 | B2 | * | 4/2002 | Ajtai et al. .................. 707/101 |
| 6,466,999 | B1 | * | 10/2002 | Sliger et al. .................. 710/68 |
| 6,704,730 | B2 | | 3/2004 | Moulton et al. |
| 6,779,003 | B1 | * | 8/2004 | Midgley et al. ............. 707/204 |
| 6,810,398 | B2 | | 10/2004 | Moulton |
| 7,007,141 | B2 | | 2/2006 | Li et al. |
| 2003/0037022 | A1 | | 2/2003 | Adya et al. |
| 2005/0060643 | A1 | * | 3/2005 | Glass et al. ............... 715/501.1 |
| 2005/0216788 | A1 | | 9/2005 | Mani-Meitav et al. |
| 2006/0112148 | A1 | * | 5/2006 | Jennings et al. ............. 707/201 |

FOREIGN PATENT DOCUMENTS

WO    WO0161563    8/2001

OTHER PUBLICATIONS

Fred Douglis and Arun Iyengar, Application-specific Delta-encoding via Resemblance Detection, 2003 USENIX Annual Technical Conference, XP-002404753.
UDI Manber, Finding Similar Files in a Large File System, http://www.usenix.org/publications/library/proceedings/sf94/full_papers/manber.finding.

* cited by examiner

Primary Examiner—Mohammad Ali
Assistant Examiner—Syed H Hasan
(74) Attorney, Agent, or Firm—Marsh Fischmann & Breyfogle LLP

(57) ABSTRACT

Provided are systems and methods for use in data archiving. In one arrangement, compression techniques are provided wherein an earlier version of a data set (e.g., file folder, etc) is utilized as a dictionary of a compression engine to compress a subsequent version of the data set. This compression identifies changes between data sets and allows for storing these differences without duplicating many common portions of the data sets. For a given version of a data set, new information is stored along with metadata used to reconstruct the version from each individual segment saved at different points in time. In this regard, the earlier data set and one or more references to stored segments of a subsequent data set may be utilized to reconstruct the subsequent data set.

7 Claims, 10 Drawing Sheets

DATA COMPRESSION AND STORAGE TECHNIQUES

CROSS-REFERENCE TO RELATED APPLICATIONS

This application claims priority under 35 U.S.C. §119 to U.S. Provisional Application No. 60/744,477, entitled "Content Factoring for Long Term Digital Archiving" having a filing date of Apr. 7, 2006, the entire contents of which are incorporated by reference herein.

FIELD

The present application is directed to storing digital data. More specifically, the present application is directed to utilities for use in more efficient storage of digital data wherein certain aspects have application in data archiving.

BACKGROUND

Organizations are facing new challenges in meeting long-term data retention requirements and IT professionals have responsibility for maintaining compliance with a myriad of new state and federal regulations and guidelines. These regulations exist because organizations, in the past, have struggled with keeping necessary information available in a useable fashion. Compounding this problem is the continued explosive growth in digital information. Documents are richer in content, and often reference related works, resulting in a tremendous amount of information to manage.

In order to better understand underlying access patterns, it's helpful to first briefly describe the classification of digital information. The collection of all digital information can be generally classified as either structured or unstructured. Structured information refers to data kept within a relational database. Unstructured information is everything else: documents, images, movies, etc. Both structured and unstructured data can be actively referenced by users or applications or kept unmodified for future reference or compliance. Of the structured and unstructured information, active information is routinely referenced or modified, whereas Inactive information is only occasionally referenced or may only have the potential of being referenced at some point in the future. The specific timeframe between when information is active or inactive is purely subjective.

A sub-classification of digital information describes the mutability of the data as either dynamic or fixed. Dynamic content changes often or continuously, such as the records within a transactional database. Fixed content is static read-only information; created and never changed, such as scanned check images or e-mail messages. With regard to long-term archiving inactive information, either structured or unstructured, is always considered to have fixed-content and does not change.

Over time, information tends to be less frequently accessed and access patterns tend to become more read-only. Fixed-content read-only information is relatively straightforward to manage from an archiving perspective. Of course, even at the sub-file level dynamic information, either structured or unstructured, may contain large segments of content which are static. Examples of this type of information include database files where content is being added, and documents which are edited.

Irrespective of the type of digital information, fixed or dynamic, many organizations back up their digital data on a fixed basis. For instance, many organizations perform a weekly backup where all digital data is duplicated. In addition, many of these organizations perform a daily incremental backup such that changes to the digital data from day-to-day may be stored. However, traditional backup systems have several drawbacks and inefficiencies. For instance, during weekly backups, where all digital data is duplicated, fixed files, which have not been altered, are duplicated. As may be appreciated, this results in an unnecessary redundancy of digital information as well as increased processing and/or bandwidth requirements. Another problem, for both weekly as well as incremental backups is that minor changes to dynamic files may result in inefficient duplication of digital data. For instance, a one-character edit of a 10 MB file requires that the entire contents of the file to be backed up and cataloged. The situation is far worse for larger files such as Outlook Personal Folders (.pst files), whereby the very act of opening these files causes them to be modified which then requires another backup.

The typical result of these drawbacks and inefficiencies is the generation of large amounts of back up data and in the most common back-up systems, the generation of multiple data storage tapes. In this regard, the inefficient backups result in the generation of multiple backup tapes, which then have to be stored. Typically, such tapes are stored off-line. That is, the tapes may be stored where computerized access is not immediately available. Accordingly, to recover information from a backup tape may require contacting an archiving facility, identifying a tape and waiting for the facility to locate and load the tape.

As the price of disk storage has come down, there have been attempts to alleviate the issues of tape backups utilizing disk backups. However, these disk backups still require large amounts storage to account for the inefficient duplication of data. Accordingly, there have been attempts to identify the dynamic changes that have occurred between a previous backup of digital data and current set of digital data. In this regard, the goal is to only create a backup of data that has changed (i.e, dynamic data) in relation to a previous set of digital data.

One attempt to identify dynamic changes between data backups and store only the dynamic changes is represented by Capacity Optimized Storage (COS). The goal of COS is to de-duplicate the redundancy between backup sets. That is, the goal of COS is to try to compare the current data set with a previously stored data set and only save the new data. Generally, COS processing divides an entire set of digital data (e.g., of a first backup copy) into data chunks (e.g., 256 kB) and applies a hashing algorithm to those data chunks. As will be appreciated by those skilled in the art, this results in a key address that represents the data according to the hash code/algorithm. When a new data set (e.g., a second back up copy) is received for backup, the data set is again divided into data chunks and the hashing algorithm is applied. In theory, if corresponding data chunks between the first and second data sets are identical, it is assumed that there has been no change between backups. Accordingly, only those chunks which are different from the first backup set are saved, thereby reducing the storage requirements for subsequent back ups. The main drawback to COS is that to significantly reduce the redundancy between backup sets, it is desirable to utilize ever smaller data chunks. However, as the size of the data chunks is reduced, the number of key addresses increases. Accordingly, the storage and indexing of the increased number of key address works to eliminate the benefits of the reduced amount of duplicate data.

Use of COS processing allows for the creation of disk accessible data back up thereby allowing for more ready access to backed up data sets. In this regard, COS may be incorporated into a virtual tape library VTL such that it emulates a tape storage device. The system allows the user to send data to an off-site disk storage center for back up. However, this requires that an entire data set be the transmitted to the VTL, where the entire data set may be optimized (e.g., COS) for storage. Further, for each subsequent backup, the entire data set must again be transferred to the offsite storage center. As may be appreciated, for large organizations having large data sets requiring backup, such an off-site storage system that requires transmission of the entire data set may involve large bandwidth requirements to transfer the data the as well as high processing requirements to optimize and compare the data. Finally, organizations utilizing off-site VTL's are 100% reliant on the backup application for restoration of their data again leaving the user potentially exposed to the unavailability of information in the case of accidental deletion or disk corruption.

SUMMARY

Existing short-term data protection solutions are cost prohibitive and do little to enable improved access to archived information. The archive techniques described herein provides a long-term solution to managing information as well as providing a solution that may be utilized in disk-based archives. The techniques use existing disk resources, and provides transparent access to collections of archived information. The technique in conjunction with an open architecture object based content store allows for large increases (e.g., 20:1) in effective capacity of disk-based systems with no changes to existing short-term data protection procedures.

In addition, to better optimize the long term storage of content, the new techniques reduce the redundant information stored for a given data set. Adaptive content factoring is a technique, developed by the inventors, in which unique data is keyed and stored once. Unlike traditional content factoring or adaptive differencing techniques, adaptive content factoring uses a heuristic method to optimize the size of each quantum of data stored. It is related to data compression, but is not limited to localized content. For a given version of a data set, new information is stored along with metadata used to reconstruct the version from each individual segment saved at different points in time. The metadata and reconstruction phase is similar to what a typical file system does when servicing I/O requests.

According to a first aspect of one invention, a method and system (utility) is provided for storing data. The utility entails receiving a first data set and compressing the first data set using a dictionary based compression engine. Such compression generates a first compressed file that represents the first data set. This first compressed file is then stored. This first compressed file may then be utilized to identify changes in a subsequent version of the first data set. As utilized herein, it will be appreciated that 'data set' is meant to include, without limitation, individual data files as well as folders that include a plurality of data files and/or drives that may include a plurality of folders. In such instances, compressing the first data set may generate a corresponding plurality of first compressed files.

In one arrangement, using the first compressed file to identify changes includes preloading a dictionary-based compression engine with the first compressed file to define a conditioned compression engine. That is, the first compressed file may be loaded into the compression engine to define a dictionary for the compression engine. If the first data set and subsequent data set are substantially similar, use of the first data set as a dictionary for the compression engine will result in a highly compressed second data set. Accordingly, the utility includes compressing the subsequent version of the first data set using the conditioned compression engine. In this regard, a second compressed file is generated that is indicative of the subsequent version of the first data set. This second compressed file may also be indicative of changes between the subsequent data set and the first data set. Further, the second compression file may include one or more references to the first compressed file. The second compressed file may be considerably smaller than the first compressed file. It will be appreciated that multiple subsequent sets of data may be compressed utilizing one or more earlier data sets as a dictionary for a dictionary based compression engine.

In order to identify corresponding portions of the first data set with corresponding portions of the second data set (e.g., corresponding files) the utility may further entail generating identifier information for one or more individual portions of the data sets. For instance, hash code information (also referred to herein as "hash information" and a "hash" or "hashes") may be generated for individual portions of the data sets. Further, such hash information may be generated for individual components of each individual portion of the data sets. In one arrangement, one or more hash codes may be associated with the metadata associate with a given file and another hash code may be generated for the content of the file. Accordingly, such hash codes may be utilized to identify corresponding portions of the first data set and the subsequent data set for compression purposes. If no corresponding hash codes exist for portions of the subsequent data set, normal compression methods may be utilized on those portions of the subsequent data set.

According to another aspect, a system and method (utility) is provided for compressing data. The utility includes receiving a file and determining that a previous version of the file has been previously stored. Once such a determination is made, the file may be compressed using compression dictionary terms generated from the previous version of the file. Accordingly, a compressed file is generated for the received file. This compressed file may then be stored. The compression dictionary terms may be generated from the previous version of the file or a compressed version of the previous version of the file. In either arrangement, the utility may include preloading a compression engine with the previous version of the file and buffering the received file in portions with the compression engine. This may allow for substantially matching the buffered portions of the received file with like sized portions of the previous file.

The determination that a previous version of the file has been previously stored may be made in any appropriate manner. For instance, files may be saved on a file by file basis wherein a user selects the previously stored version of the file during a back-up procedure. In another arrangement, hashes associated with the version references (e.g., associated with metadata of the files) may be utilized to determine relationships between the files. In one arrangement, first and second hashes are associated with the metadata of the previously stored file and the received file. In such an arrangement a corresponding first hash of the files may match (e.g., corresponding to a storage location) while a second corresponding hash (e.g., a version reference) of the files may not match. In this regard, it may be determined that the files are related but have changes there between. Accordingly, it may be desirable to compress the subsequent file utilizing the previous file in order to reduce volume for back-up purposes.

According to another inventive aspect, a system and method (utility) is provided for use in archiving and/or storing data. The utility entails generating an individual signature for a data set such that the signature may be compared to subsequent data sets to identify corresponding or like portions and, hence, differences between those data sets. Accordingly, like portions of the data sets need not be copied in a back-up procedure. Rather, only new portions (e.g., differences) of the subsequent data set need be copied for archiving/back-up purposes.

One aspect, the utility includes generating a first signature associated with the first data set. Wherein generating the first signature includes generating a first set of hashes (e.g., hash codes) associated with metadata of the first data set. In addition, a set of content hashes is generated for the first data set that is associated with the content of the first data set. For instance each individual file in a data set may include a first hash associated with metadata (e.g. an identifier hash) and a second hash associated with its content (e.g., a content hash). Once generated, the signature including the first hashes and the content hashes may be utilized individually and/or in combination to identify changes between first data set and a subsequent data set. For instance, an identifier hash of the first data set may be compared with corresponding hashes of a subsequent data set. Based on such comparison, it may be determined that changes exist between one or more portions of the first data set and the subsequent data set. That is, it may be determined if changes exist between one or multiple portions of the first and second data sets.

In one arrangement, if an identifier hash of the second data set does not match an identifier hash of the first data set, content associated with the unmatched identifier hash may be compared to content of the first data set. More particularly, that content may be hashed and the resulting content hash code may be compared to content hash codes associated with the first data set. In this regard, even if the identifier of the content does not match an identifier in the first data set, a second check may be performed to determine if the content already exists in the first data set. If the content hash code exits, the content may not be transmitted to a storage location or otherwise stored. If the content hash code of the unmatched identifier hash does not match a content hash code within the first data set, that content may be stored at a storage location.

In one arrangement, the identifier hash, which is associated with metadata, may include first and second identifier hashes. Each of these hashes may be associated with portions of metadata. For instance, one of theses hashes may be a sub-portion of the other hash. In this regard, finer comparisons may be made between data sets to identify changes there between.

In a further inventive aspect, systems and methods (utilities) are provided for allowing distributed processing for archiving purposes. In this regard, rather than transferring an entire data set to an archive location, the identification of changes between an archive data set and a current data set may be performed at the location of the current data set (e.g., a data origination location). Accordingly, the only information that may be sent to the archive location may be differences between a previously stored data set and the current data set.

According to one aspect, a first data set is received for storage (e.g., at an archive/back-up location). Accordingly, a set of identifier hashes may be generated that are associated with metadata of the first data set. Likewise, a set of content hashes associated with the content of the first data set are also generated. When it becomes necessary to back-up a current set of data associated with the first data set, the identifier hashes and content hashes may be provided to a data origination location associated with the first data set. These hashes may be utilized at the data origination location to determine changes between the first data set and the subsequent data set such that the changes may be forwarded to the storage location. In this regard, the utility also entails receiving data from the subsequent data set that fails to match one or both of the provided identifier hashes and/or the content hashes. At such time, newly received data may be hashed and that hash information may be added to the existing hash information for subsequent back-up purposes.

According to another aspect, a utility is provided wherein a set of identifier hashes associated with metadata of a previously stored data set are received. These identifier hashes are compared to identifier hashes of a current data set. At least a portion of this data set may form a subsequent version of the previously stored dataset. Comparing of the identifier hashes allows for identifying unmatched identifier hashes of the current data set. Accordingly, a portion or all of the content associated with the unmatched identifier hashes may be sent to a storage location.

In a further arrangement, the utility further includes receiving a set of content hashes associated with content of the previously stored data set. In such an arrangement, content hashes associated with the content of the unmatched hashes of a current data set may be compared with the content hashes of the previously stored data set. Accordingly, in such an arrangement, if neither the identifier hash nor the content hash corresponds to a hash of the previously stored data set, the unmatched content may be sent to a storage location.

In the proceeding two aspects, the steps of sending/providing and/or receiving may be performed by a direct connection between, for example, a computer and a storage location (e.g., direct attached storage, a removable hard drive or other portable storage device) or may be performed by a network connection. In the later regard, such network connection may include a wide area network, the internet, direct attached storage network and/or peer computer.

In a further aspect, a system and method are providing for storing and providing access to a plurality of different versions (e.g., sequential versions) of a data set. The utility includes generating a catalog of the different data sets at different points in time. Each catalog includes information needed to reconstruct an associated data set at a particular point in time. That is, rather than generating a full copy of a particular data set for a point in time, the present utility generates a catalog having references to the location of data required to reconstruct a given data set.

In one arrangement, the catalog may include various hash codes for different streams of data (e.g., components of a file). These hash codes may allow for identifying and locating the components of a given file within the catalog. Accordingly, these components may be reconstructed to form the file in the form it existed when the catalog was generated. Stated otherwise, rather than storing the data of a given file, the catalog stores references to the location of the data associated with the file such that duplicating components of the file is not always necessary. Further, it will be appreciated that the stored references of a given catalog may reference different segments of a given file that may be saved at different times.

BRIEF DESCRIPTION OF THE DRAWINGS

Exemplary embodiments are illustrated in referenced figures of the drawings. It is intended that the embodiments and figures disclosed herein be considered illustrative rather than limiting.

DETAILED DESCRIPTION

Reference will now be made to the accompanying drawings, which assist in illustrating the various pertinent features of the present invention. Although the present invention will now be described primarily in conjunction with archiving/back-up storage of electronic data, it should be expressly understood that the present invention may be applicable to other applications where it is desired to achieve the objectives of the inventions contained herein. That is, aspects of the presented inventions may be utilized in any data storage environment. In this regard, the following description of use for archiving is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

Strict use of backup and restore processes alone for the purpose of archiving are unacceptable for most regulated environments. With regard to disk-based backup environments using traditional methods are generally cost prohibitive. Two common methods to address increased availability and minimize cost of disk storage are to incorporate either Hardware Based Disk Libraries (HBDL), or Virtual Tape Libraries (VTL). Neither solution deals with data redundancy issues and these solutions do little to reduce overall Total Cost of Ownership (TCO).

An alternate approach adopted by IT organizations is to employ block level snap-shot technologies, such as a volume shadow copy service, or similar hardware vendor provided snap-shot technology. In this scenario changed blocks are recorded for a given recovery point. However, these systems typically reset (roll-over) after a specified number of snap-shots or when a volume capacity threshold is reached. In all cases, after blocks are reused deleted information is no longer available. Furthermore, snap-shot technologies lack any capability to organize data suitable for long-term archiving.

Figure 1:
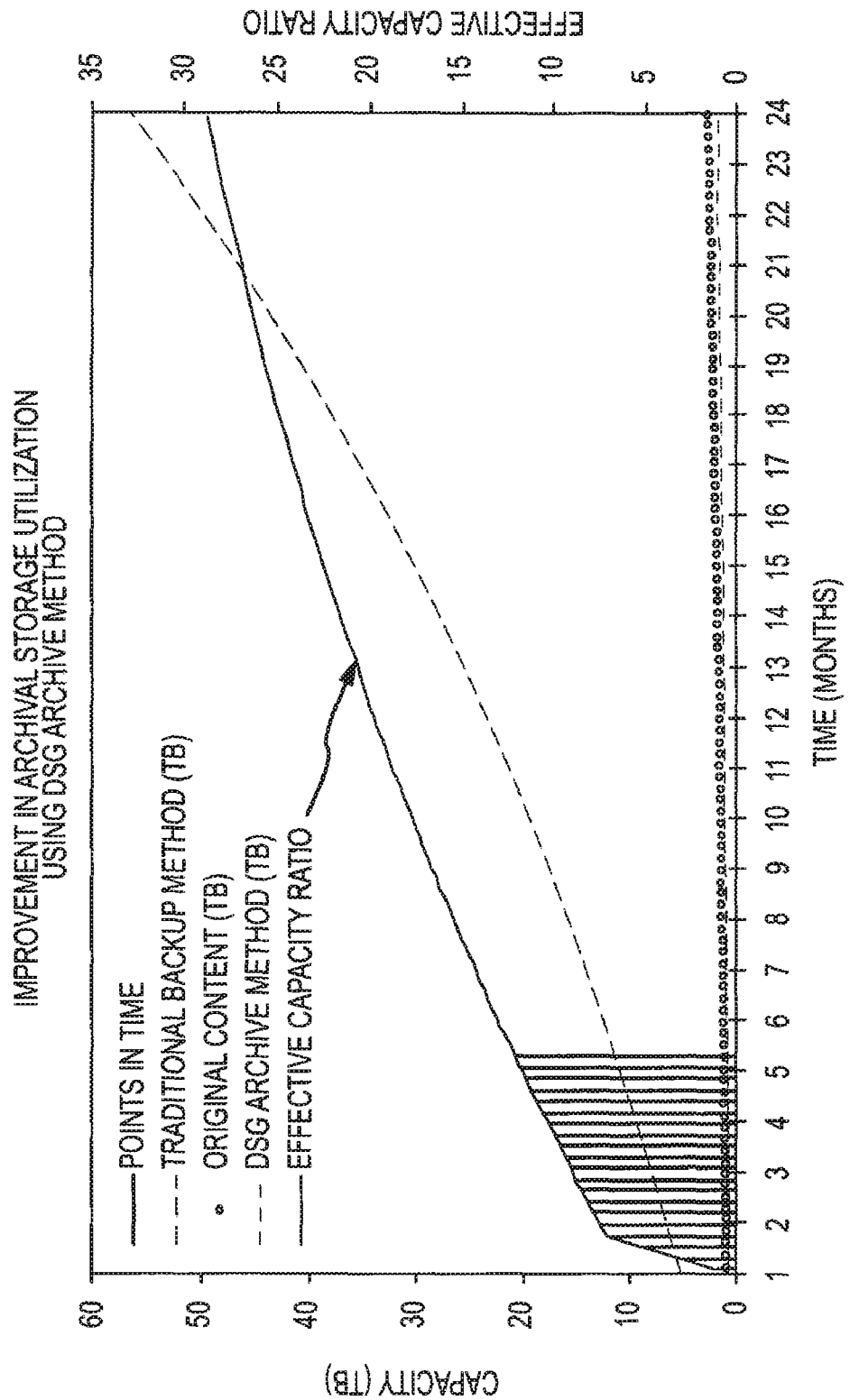
FIG. 1 illustrates long term storage requirements for a data set.

FIG. 1 shows the capacity required to manage a one terabyte volume for two years using a typical 4-week rotation scheme that includes keeping monthly volume images to address archiving requirements. This example models a 50% compound annual growth rate of data. While the overall volume of data to be backed up increases 50%, the data resources required to back-up this data over a year's time based on existing back-up techniques is nearly twenty times that of the original content/data. Also shown is the near-linear scaling, with respect to the original content/data, which can be achieved by using a disk-based archiving method based on techniques (e.g., adaptive content factoring techniques) provided herein. Note that the backend storage requirements are reduced by nearly 20 fold (see axis labeled Effective Capacity Ratio) while providing an increased number of recovery points and improved near-line access to archived information. The TCO approaches that of traditional tape-based backup systems when deployed on low to mid-range disk storage.

The archive technique disclosed herein is characterized as a long-term data retention strategy that may also allow for on-line/dynamic access to reference/stored information. The technique utilizes adaptive content factoring to increase the effective capacity of disk-based storage systems significantly reducing the TCO for digital archiving. Unlike traditional backup and recovery, all the data managed can be on-line and available. Further all the data within the archive remains accessible until it expires. Integrated search and archive collection management features improve the overall organization and management of archived information.

To better optimize the long term storage of content, the new archiving techniques reduce the redundant information stored for a given data set. As redundant information is reduced, fewer storage resources are required to store sequential versions of data. In this regard, adaptive content factoring is a technique in which unique data is keyed and stored once. Unlike traditional content factoring or adaptive differencing techniques, adaptive content factoring uses a heuristic method to optimize the size of each quantum of data stored. It is related to data compression, but is not limited to localized content. For a given version of a data set, new information is stored along with metadata used to reconstruct the version from each individual segment saved at different points in time. The metadata and reconstruction phase is similar to what a typical file system does when servicing I/O requests.

Figure 2:
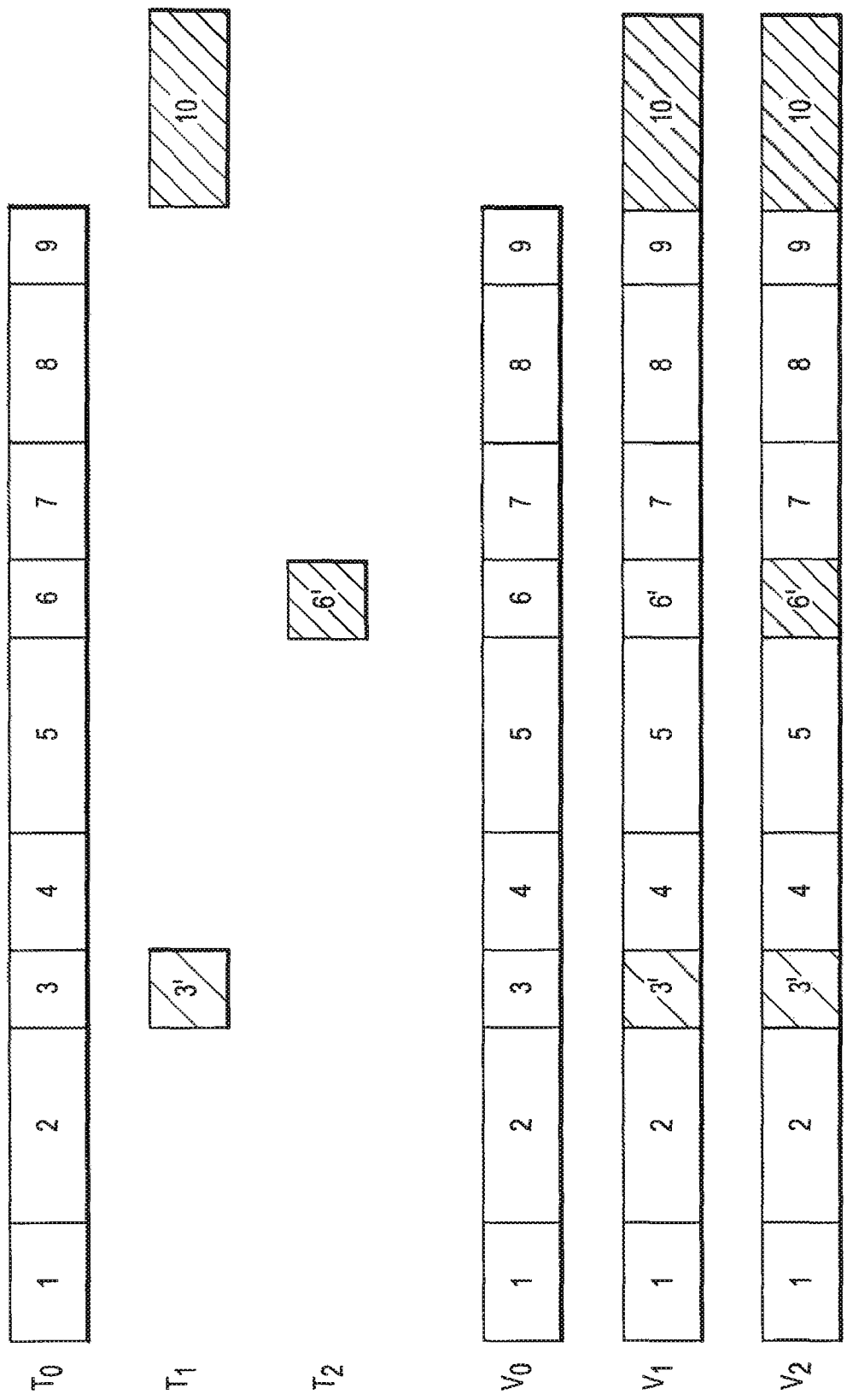
FIG. 2 illustrates changes to a data set between versions.

FIG. 2 shows the basic concept behind adaptive content factoring. At $T_0$ a data set $V_0$ (a file, volume, or database) is segmented and the individual elements are keyed and stored along with the metadata that describes the segments and process used to reconstruct the data set. At $T_1$ and $T_2$ the data set is updated such that the data sets become $V_1$ and $V_2$, respectively. However, rather than storing the entire new versions of the data sets $V_1$ and $V_2$ only the changes that represent the update portions of the data sets are stored along with the metadata used to reconstruct versions $V_1$ and $V_2$.

As will be further discussed herein, a novel method is providing for identifying changes (e.g., data blocks 3' and 10) between an initial data set $V_0$ and a subsequent data set $V_1$ such that large sets of data chunks (e.g., files, directories etc) may be compared to a prior version of the file or directory such that only the changes in a subsequent version are archived. In this regard, portions of the original data set $V_0$ (e.g., a baseline version) which have not changed (e.g., data blocks 1,2 and 4-9) are not unnecessarily duplicated. Rather, when recreating a file or directory that includes a set of changes, the baseline version of the file/directory is utilized, and recorded changes (e.g., 3' and 10) or delta are incorporated into the recovered subsequent version. In this regard, when backing up the data set $V_1$ at time $T_1$, only the changes to the initial data set $V_0$ need to be saved to effectively back up the data set $V_1$.

In order to identify the changes between subsequent versions of a data set (e.g., $V_0$ and $V_1$), the present invention utilizes a novel compression technique. As will be appreciated, data compression works by the identification of patterns in a stream of data. Data compression algorithms choose a more efficient method to represent the same information. Essentially, an algorithm is applied to the data in order to remove as much redundancy as possible. The efficiency and effectiveness of a compression scheme is measured by its compression ratio, the ratio of the size of uncompressed data to compressed data. A compression ratio of 2 to 1 (which is relatively common in standard compression algorithms) means the compressed data is half the size of the original data.

Various compression algorithms/engines utilize different methodologies for compressing data. However, certain lossless compression algorithms are dictionary-based compression algorithms. Dictionary based algorithms are built around the insight that it is possible to automatically build a dictionary of previously seen strings in the text that is being compressed. In this regard, the dictionary (e.g., resulting compressed file) generated during compression does not have to be transmitted with compressed text since a decompressor can build it in the same manner of the compressor and, if coded correctly, will have exactly the same strings the compressor dictionary had at the same point in the text. In such an arrangement, the dictionary is generated in conjunction with an initial compression.

The present inventors have recognized that a dictionary may, instead of being generated during compression, be provided to a compressor for the purpose of compressing a data set. In particular, the inventors have recognized that an original data set $V_0$ associated with a first time $T_0$ as shown in FIG. 2, may be utilized as a dictionary to compress a subsequent corresponding data set $V_1$ at a subsequent time $T_1$. In this regard, the compressor utilizes the original data set $V_0$ as the dictionary and large strings of data in the subsequent data set $V_1$ may be entirely duplicative of strings in the first set. For instance, as illustrated in FIG. 2, the actual storage of $V_1$ at time $T_1$ may incorporate a number of blocks that correspond to the data blocks of $V_0$ at time $T_0$. That is, some of the blocks in the second data set $V_1$ are unchanged between data sets. Therefore, rather than storing the unchanged data block (e.g., duplicating the data block) an identifier referencing the corresponding data block from $V_0$ may be stored. Accordingly, such an identifier may be very small, for example, on the order of 10 bytes. For instance, the identifier may references a dictionary block of the baseline. In instances where there has been a change to a block of data, for example, 3', the compressor may be operative to compress the changes of 3' into an entry that includes differences to the baseline $V_0$, as well as any changes in block 3. In addition, if additional text is added to the subsequent version (e.g., block 10'), this may be saved in the subsequent version $T_1$.

In instances where very minor changes are made between subsequent versions of a data set, very large compression ratios may be achieved. These compression ratios may be on the order of 50 to 1, 100 to 1, 200 to 1 or even larger. That is, in instances where a single character is changed within a 10-page text document, the compression between the original version and the subsequent version may be almost complete, except for the one minor change. As will be appreciated, utilization of the original data set as the originating dictionary for a compression algorithm allows for readily identifying changes between subsequent data sets such that very little storage is required to store subsequent changes form the baseline data set $V_0$. Accordingly, when it is time to recreate a subsequent version of a data set, the dictionary identifiers for the desired version of the data set may be identified. In this regard, when there is no change, the dictionary identifiers may point back to the original block of the baseline data set $V_0$. In instances when there is a change (e.g., 3' or 6'), the identifier may point back to the original baseline data set and a delta data set. Such an arrangement allows for saving multiple subsequent versions of data sets utilizing limited storage resources.

The method works especially well when there are minor changes between back-ups of subsequent versions of data sets. However, even in instances where significant changes occur to a data set in relation to a previously backed-up data set, a significant reduction in the size of the data is still achieved. For instance, if an original data set corresponds with a 10-page text document and the subsequent corresponding document incorporates 15 new pages (i.e., for a combined total of 25 pages), the first 10 pages may achieve near perfect compression (e.g., 200 to 1), whereas the 15 pages of new text may be compressed on a more normal order of compression of, for example, 2 to 1. However, further subsequent back-ups (e.g., a third version) may utilize the new text of versions 1 and 2 as the baseline references. Alternatively, when compression fails to achieve certain predetermined compression ratio threshold, it may be determined that changes are significant enough to warrant replacing the original version of the data with the subsequent version of data, which then becomes the baseline value.

Figure 3:
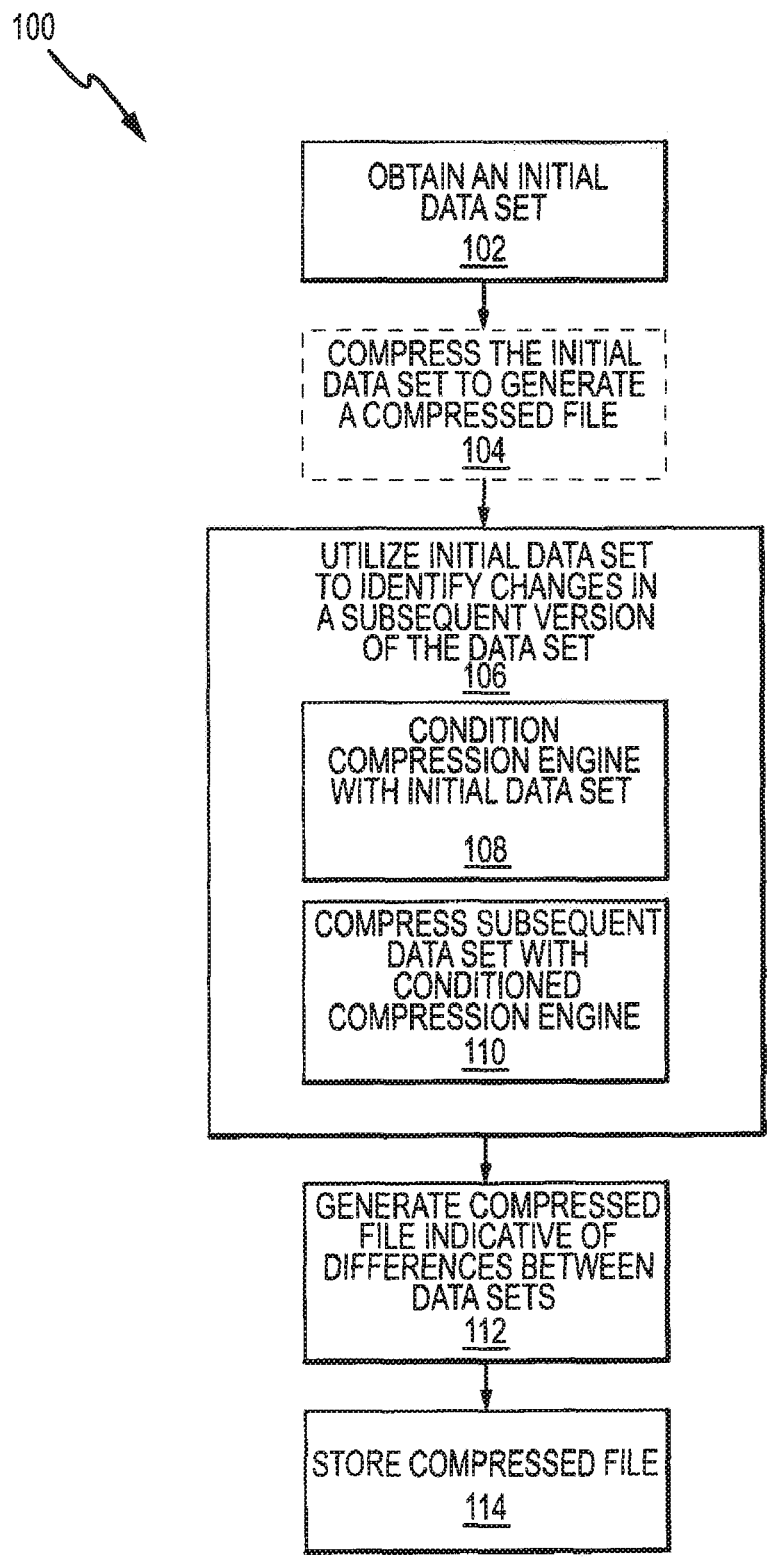
FIG. 3 illustrates a process for identifying differences between related data sets.

FIG. 3 illustrates a process 100 where a baseline data set is utilized to compress subsequent versions of the data set. As shown, an initial data set is obtained 102. This may entail receiving and storing the initial data set and/or compressing 104 the initial data set utilizing, for example, a standard compression technique. In this regard, a compressed file may be generated that represents the initial data set. A subsequent time, the initial data set may be utilized 106 to identify differences in a subsequent date set. Such utilization may include conditioning 108 a dictionary based compression engine with the original data the (compressed or uncompressed) and compressing 110 the subsequent data set utilizing the compression engine that utilizes the original data set as a dictionary. This generates 112 a compressed file that is indicative of the changes between the initial data set and the subsequent data set. Further, such compressed file may include references to the compression dictionary (e.g., the original data set and/or the initial compressed file). Accordingly, the compressed file, which indicative of the subsequent data set may be stored 114 as a point in time archive, which may be subsequently accessed to enable, for example, data restoration. The use of the baseline data set as a dictionary for compression of subsequent corresponding data sets facilitates, in part, a number of the following applications. However, it will be appreciated that aspects of the following application are novel in and of themselves.

To provide archiving services that may take advantage, at least in part, of the compression technique discussed above, an initial data set must be originally cataloged. Such a catalog forms a map of the location of the various components of a data set and allows the reconstruction of a data set at a later time. In this regard, the first time a set of data is originally backed up to generate a baseline version of that data, the data may be hashed using one or more known hashing algorithms. In this regard, the initial cataloging process is at its core similar to existing processes. However, as opposed to other archiving processes that utilize hashing, the present application utilizes multiple hashes for different portions of the data sets. Further, the present application may use two or more hashes for a common component.

For instance, a data set may be broken into three different data streams, which may each be hashed. These data streams may include baseline references that include Drive/Folder/File Name and/or server identifications for different files, folders and/or data sets. That is, the baseline references relates to the identification of larger sets/blocks of data. A second hash is performed on the metadata (e.g., version references) for each of the baseline references. In the present embodiment, the first hash relating to the baseline reference (e.g., storage location) may be a sub-set of the meta-data utilized to form the second hash. In this regard, it will be appreciated that metadata associated with each file of a data set may include a number of different properties. For instance, there are between 12 and 15 properties for each such version reference. These properties include name, path, server & volume, last modified time, file reference id, file size, file attributes, object id, security id, and last archive time. Finally, for each baseline reference, there is raw data or Blobs (Binary large objects) of data. Generally, such Blobs of data may include file content and/or security information. By separating the data set into these three components and hashing each of these components, multiple checks may be performed on each data set to identify changes for subsequent versions.

```
1st Hash
    Baseline Reference - Bref
        Primary Fields
            Path\Folder\Filename
        Volume Context
    Qualifier
        Last Archive Time
2nd Hash
Version Reference - Vref (12-15 properties)
    Primary Fields (change indicators)
        Path\Folder\Filename
        Reference Context (one or three fields)
        File Last Modification Time (two fields)
        File Reference ID
        File Size (two fields)
    Secondary Fields (change indicators)
        File Attributes
        File ObjectID
        File SecurityID
    Qualifier
        Last Archive Time
    3rd Hash (majority of the data)
    Blobs (individual data streams)
        Primary Data Stream
        Security Data Stream
        Remaining Data Streams (except Object ID Stream)
```

In another arrangement, a compound hash is made of two or more hash codes. That is, the VRef, BRef, and Blob identifiers may be made up of two hash codes. For instance, a high-frequency (strong) hash algorithm may be utilized, alongside a low-frequency (weaker) hash algorithm. The weak hash code indicates how good the strong hash is and is a first order indicator for a probable hash code collision (i.e, matching hash). Alternately, an even stronger (more bytes) hash code could be utilized, however, the processing time required to generate yet stronger hash codes may become problematic. A compound hash code may be represented as:

```
ba="01154943b7a6ee0e1b3db1ddf0996e924b60321d"
    |   strong hash component       | weak   |
    |   high-frequency               | low    |
```

In this regard, two hash codes, which require lees combined processing resources than a single larger hash code are stacked. The resulting code allows for providing additional information regarding a portion/file of a data set.

Figure 4:
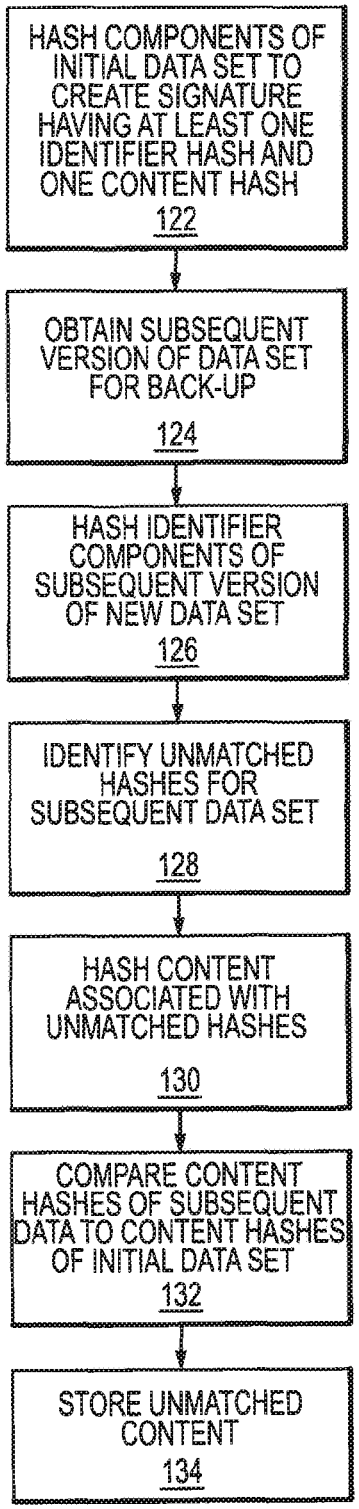
FIG. 4 illustrates a process for generating a signature for a data set.

Generally, as illustrated by FIG. 4, an initial set of data is hashed into different properties in order to create a signature 122 associated with that data set. This signature may include a number of different hash codes for individual portions (e.g. files) of the data set. Further each portion of the data set may include multiple hashes (e.g., hashes 1-3), which may be indexed to one another. For instance, the hashes for each portion of the data set may include identifier hashes associated with the meta data (e.g., baseline references and/or version references) as well as a content hash associated with the content of that portion of the data set. When a subsequent data set is obtained 124 such that a back-up may be performed, the subsequent data set may be hashed to generate hash codes for comparison with the signature hash codes.

However, as opposed to hashing all the data, the meta data and the baseline references, or identifier components of the subsequent data set, which generally comprise a small volume of data in comparison to the data Blobs, may initially be hashed 126 in order identify files 128 (e.g., unmatched hashes) that have changed or been added since the initial baseline storage. In this regard, content of the unmatched hashes (e.g., Blobs of files) that are identified as having been changed may then be hashed 130 and compared 132 to stored versions of the baseline data set. As will be appreciated, in some instances a name of a file may change between first and second back ups. However, it is not uncommon for no changes to be made to the text of the file. In such an instance, hashes between the version references may indicate a change in the modification time between the first and second back ups. Accordingly, it may be desirable to identify content hashes associated with the initial data set and compare them with the content hashes of the subsequent data set. As will be appreciated, if no changes occurred to the text of the document between back ups, the content hashes and their associated data (e.g., Blobs) may be identical. In this regard, there is no need to save data associated with the renamed file (e.g., duplicate previously saved data). Accordingly, a new file name may share a reference to the baseline Blob of the original file. Similarly, a file with identical content may reside on different volumes of the same server or on different servers. For example, many systems within a workgroup contain the same copy of application files for Microsoft Word®, or the files that make up the Microsoft Windows® operating systems. Accordingly, the file contents of each of these files may be identical. In this regard, there is no need to resave data associated with the identical file found on another server. Accordingly, the file will share a reference to the baseline Blob of the original file from another volume or server. In instances where there is unmatched content in the subsequent version of the data set from the baseline version of the data set, a subsequent Blob may be stored 134 and/or compressed and stored 134.

Importantly, the process 120 of FIG. 4 may be distributed. In this regard, the hash codes associated with the stored data may be provided to the origination location of the data. That is, the initial data set may be stored at an off-site location. By providing the hash codes to data origination location, the determination of what is new content may be made at the origination location of the data. Accordingly, only new data may need to be transferred to a storage location. As will be appreciated, this reduces the bandwidth requirements for transferring backup data to an off-site storage location.

Figure 5:
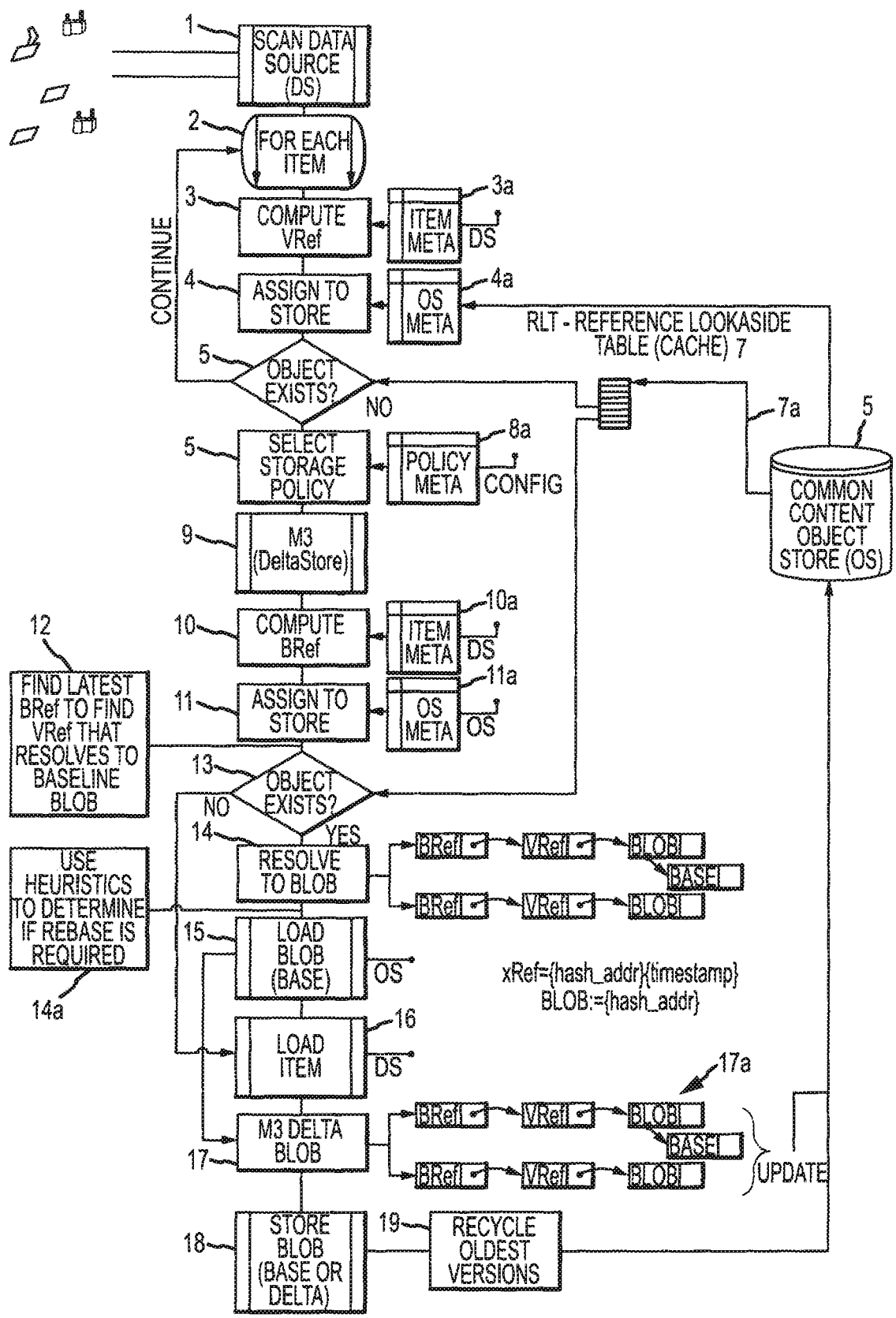
FIG. 5 illustrates a process for storing data.

FIG. 5 illustrates one embodiment of a process for archiving data in accordance with certain aspects of the present invention. Initially, an original set of data is received 1. This data set may include, without limitation, data received from a server, database or file system. This data is typically received for the purpose of backing-up or archiving the data. Each item/object (e.g., file, folder, or arbitrary blocks of data) within the received data is processed 2 and a version reference ("Vref") is computed 3. As noted above, the Vref includes numerous fields relating to the meta-data 3a of the objects. These fields may include Primary fields and Secondary fields. These fields may be utilized to identify changes between archiving (i.e., backing-up) of first and subsequent instances of data sets.

This initially allows for determining if the object data already exists within the archive system. Once the Vref is computed 3, it is assigned to an object store 4, 4a. Once the assignment is made, a comparison 5 is performed with the common content object store to determine 6 if the object associated with the Vref already exists (i.e., from a previous archive operation). This determination is performed utilizing the Reference Lookaside Table 7. The Reference Lookaside Table 7 is a table that includes Vref and Bref hash codes. In any case, if the Vref of an object from the newly received data is equivalent to a Vref of a previously archived object, a determination is made that the object may already exist. If no match is located, processing proceeds as discussed herein. In the event no match is located within the Reference Lookaside Table 7, the existence of the object is further determined by searching the Object Store. If a match is found the Vref is loaded into the Reference Lookaside Table.

If no match is identified (e.g., the object represents new data or data that has been modified since an earlier back-up), a storage policy is selected 8 for archiving the data. In the illustrated embodiment, a general purpose policy may be selected. As may be appreciated, different policies may be selected for different data types. For instance, a general purpose policy may be selected for data that is unknown. In contrast, for data sets where one or more components of the data is known, it may be preferable to select policies that better match the needs of the particular data set. Once a policy is selected 9, the process continues and a baseline reference ("Bref") 9 is computed for each previously unmatched object 10a of the data source. A subset of the Vref data is utilized to compute the baseline or Bref data. Specifically, the metadata that is outlined above is utilized to compute a hash for the baseline reference objects.

Once Bref 9 is computed for an object, it is assigned 11 to a store. This assignment 11 is based on the same assignment 11 made for the corresponding Vref. Typically, the Bref computed is the latest Bref. However, in some instances, the metadata, while being identical for first and second points in time (e.g., first and second archiving processes), the object data may change. In such instances, a determination 12 is made if the current Bref is the latest Bref by a comparison with other Bref data in the object store using the Last Archive Time qualifier. This allows for a redundancy check to assure there have been or have not been changes between corresponding objects of different archiving processes.

A determination 13 is then made if the current Bref already exists within the object store. Again, the Reference Lookaside Table 7 is utilized for this determination. In this regard, the hash of the current Bref data is compared to existing hashes within the Reference Lookaside Table 7.

If the object already exists, it is resolved to a Blob 14 (i.e. a binary large object) comprising a series of binary data zeros and ones. The Bref is utilized to look up the Vref, which is then utilized to look up the associated Blob of data. In some instances, the Blob of data may reference a further Blob, which is a root baseline Blob. In some instances, Blobs of common data exist for many objects. For instance, the operating system of numerous separate computers may be substantially identical having many of the same files. Accordingly, when the backup of such separate computers is performed, the resulting Blobs for the common files may be identical. Therefore the Vref and Brefs of different objects may reference the same Blobs.

Once a baseline Blob is located, it is loaded 15 as a dictionary for the compression algorithm. When the Blob is loaded 15 into the dictionary, it may be broken into individual chunks of data. For instance, the baseline Blob may be broken into 30 KB data chunks or into other arbitrary sized data chunks based on operator selection. These individual chunks may be loaded into the compressor to precondition a compressing algorithm.

It will be noted that any of a plurality of known compression techniques can be utilized so long as it may be preconditioned. In the present case, the compression algorithm is preconditioned with portions or entirety of the Blob data. Up to this point, all data that has been processed has been metadata. However, at this point, the received object is hashed as it is being compressed 16 using the compressing algorithm preconditioned with the baseline Blob. If the object has a Bref the changes between the new object and the baseline object are determined by the resultant compression of the item, called a delta Blob 17. If the object has a Bref the corresponding delta Blob is often only a fraction of the size of baseline Blob and compression ratios of 100:1 are not uncommon The process to identify changes is referred to as the delta Blob process. The output of the delta Blob process is a binary set of data that may represent either the difference between a baseline data set and a new data set or, in the case where no baseline exists, the output may become the baseline for future reference purposes. In either case, the delta or baseline Blob is represented by the hash of the received data and is copied/stored 18 to the object store 5, if it does not currently exist. Optionally, older versions, as determined by the Last Archive Time qualifier, of Brefs and their corresponding Vref, and baseline or delta Blob data may be recycled to free space within the object store.

As will be appreciated the archiving system described above is fully self contained and has no external storage requirements. As such the entire object store 5 may be hosted on a single removable unit of media for the purpose of offsite storage. Because all indexes and references and content are maintained within a single file structure as individual items, and since none of the item stored are not required to be updated, any facility to replicate the object store to an alternate or remote location may be employed. The unique storage layout provides a fault tolerant structure that isolates the impact of any given disk corruption. Furthermore the referential integrity of items may be verified and any faults isolated. Subsequent archiving jobs may be used to auto-heal detected corruptions. With regard to removable media, once the base object store layout and tree depth is defined, the identical structure may be duplicated on any number of removable media in such a manner that provides for continuous rotation of media across independent points-in-time. The process is similar to tape media rotation, though far more efficient since common content is factored. The structure facilitates the requirements for equivalent media units by 20:1 or more.

Figure 7:
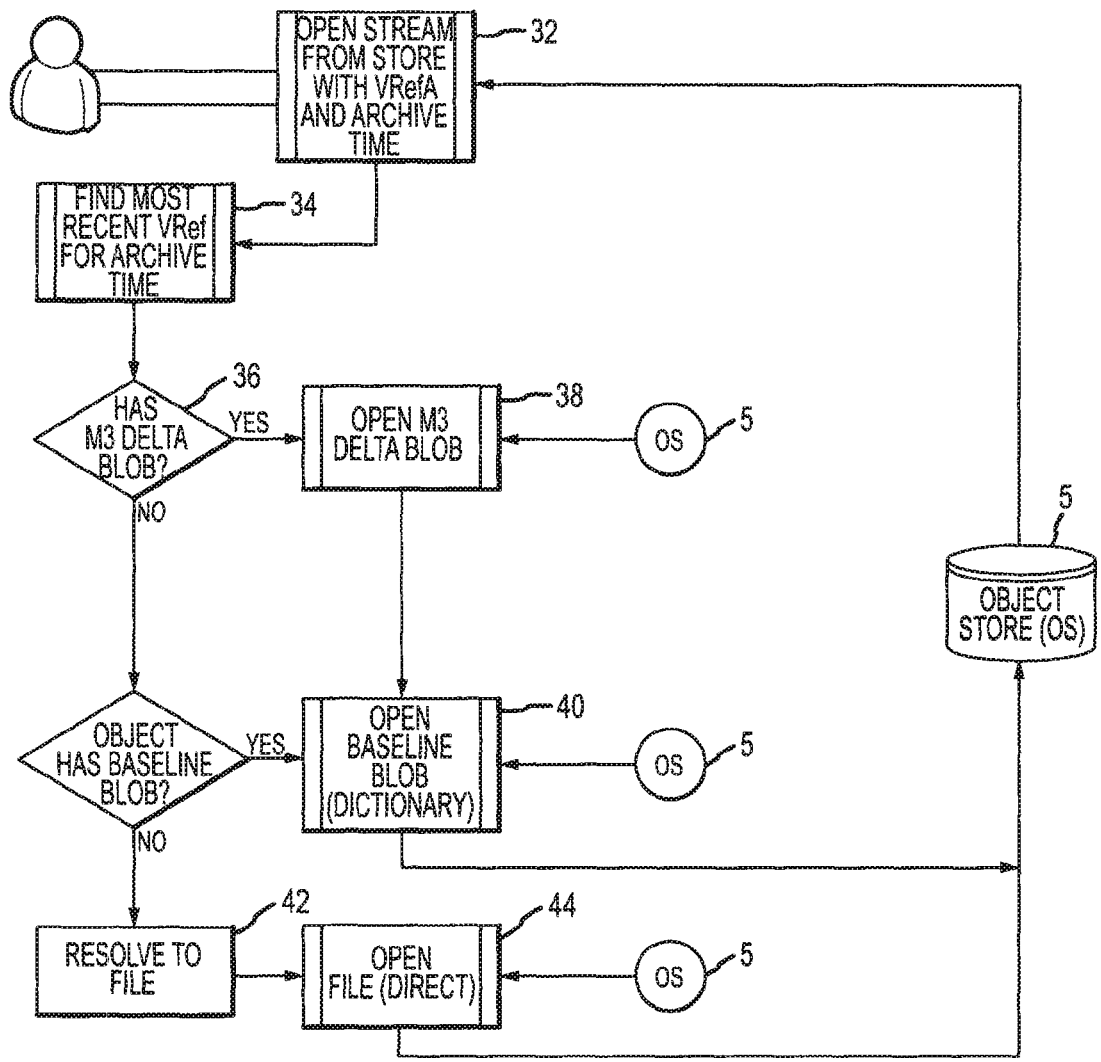
FIG. 7 illustrates a process for retrieving data.
Figure 8:
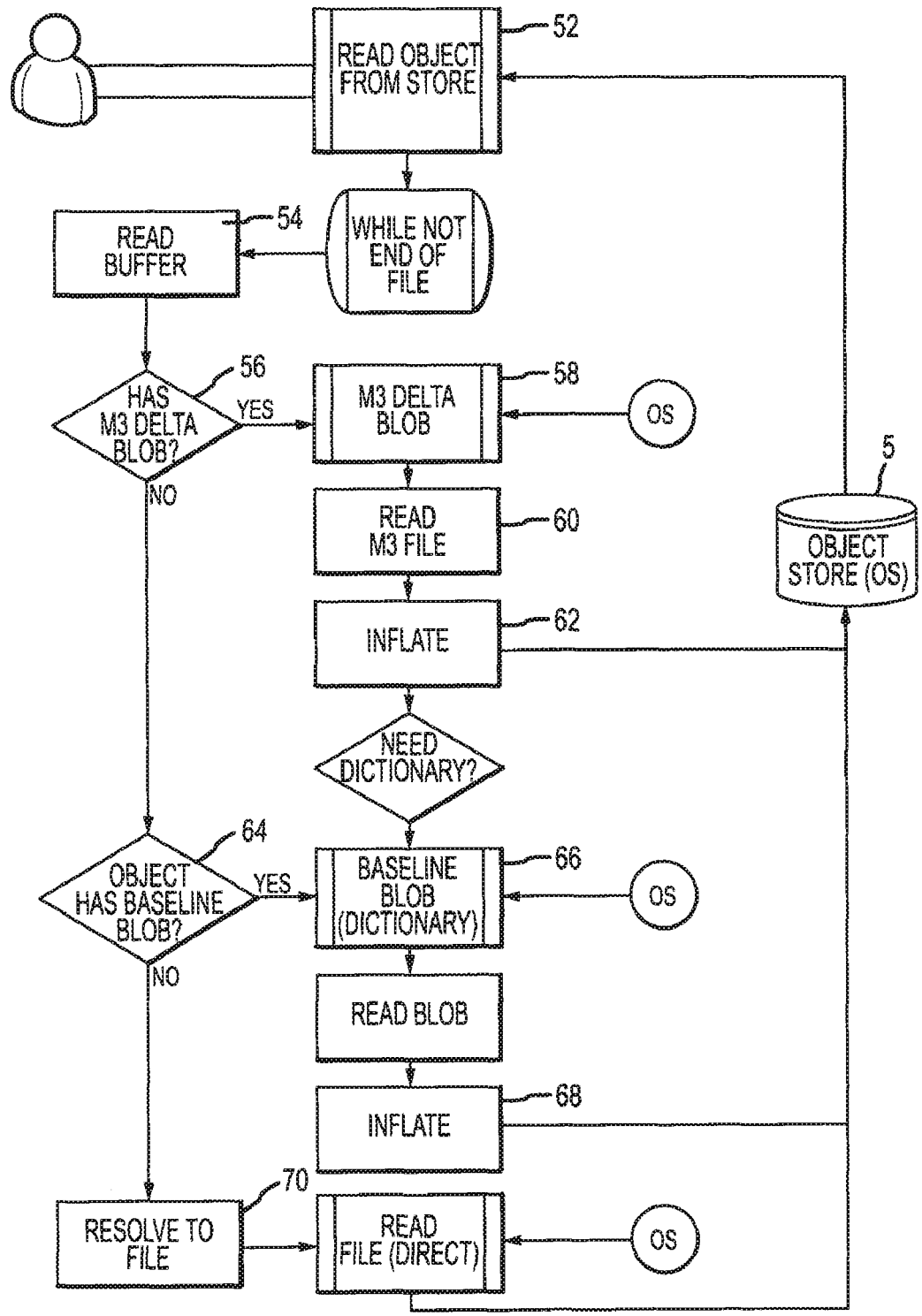
FIG. 8 illustrates a process for reconstructing data.

FIGS. 7 and 8 illustrate reconstruction of data from an object store. As noted, the process allows for real-time reconstruction of data, that is, dynamic or 'on-the-fly'. To provide such dynamic reconstruction, the archived data is represented in a virtual file system that is accessible by a user attempting to reconstruct data. To reconstruct data, the address of a desired object or file must be known. How that address comes to be known is discussed below.

Figure 6:
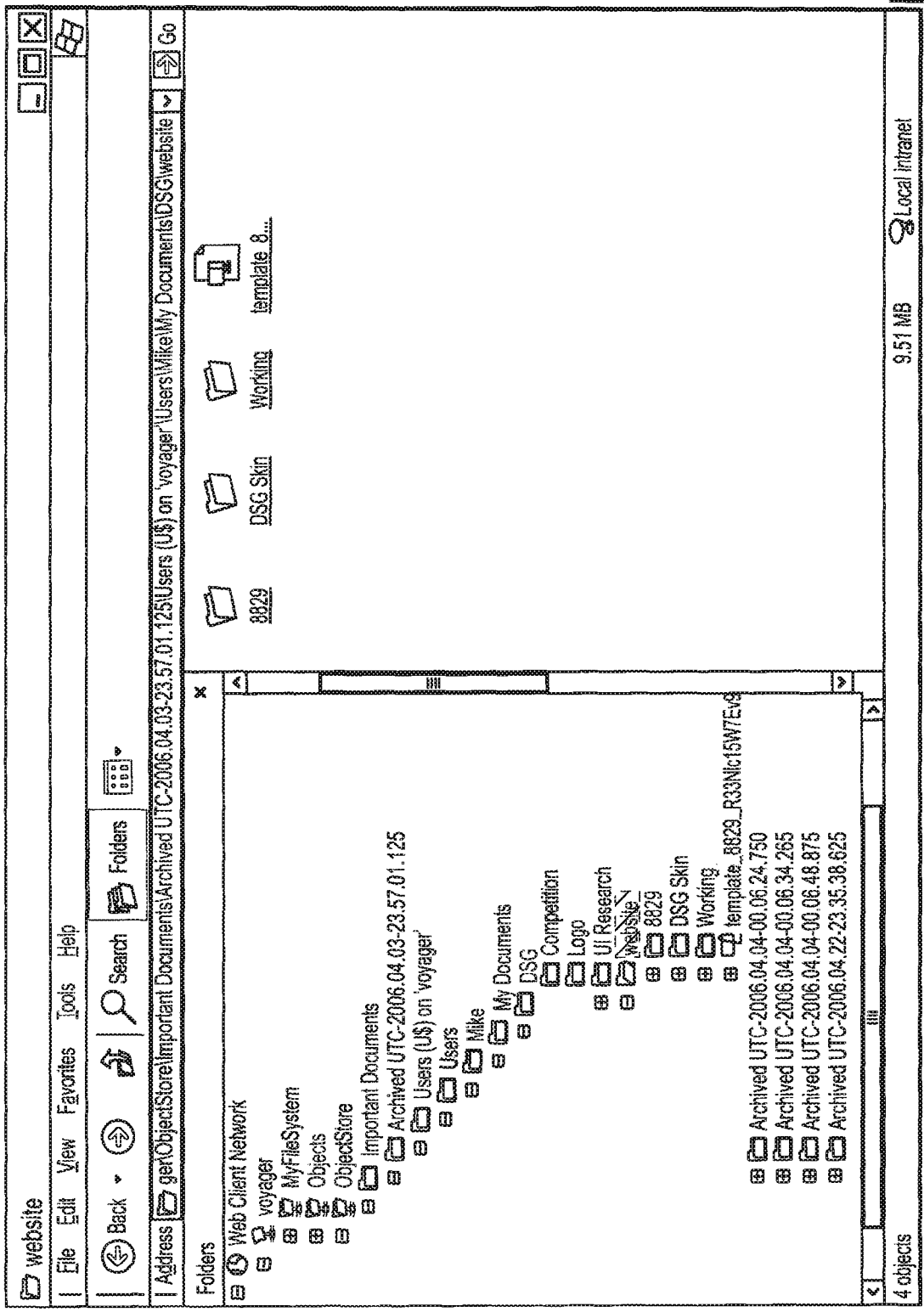
FIG. 6 illustrates an accessible catalog of multiple archive catalogs.

Initially, all the data within the system is stored within the object store and may be represented in a virtual file system as illustrated in FIG. 6, which illustrates accessing archived data using the virtual file system, and in the present embodiment, a web client network. However, it will be appreciated that access to archived data can be via a stand alone unit attached to a system for which archiving is desired. Certain aspects of the virtual file system (VFS) are applicable to both systems. In the case of web client network, access to the archived data can be achieved via WebDAV using the Windows WebClient service redirector. This redirector allows for access to archived data using a universal name convention (UNC) path. With this instance the entry point to viewing archived data is through the UNC path \voyager\ObjectStore. In addition, the WebClient redirector supports mapping a drive letter to a UNC path. For instance, the drive letter L: could be assigned to \voyager\ObjectStore. It should be noted that a drive letter mapping can be assigned to any level of the hierarchy. For instance, X: could be mapped to \voyager\ObjectStore\Important Documents directly.

FIG. 6 shows the object store entry in the VFS hierarchy. In this example the object store instance is called ObjectStore. Object stores contain both archived data pooled from multiple resources, (e.g., common content from multiple sources) and archives that more tightly define a particular/individual data set or catalog. That is, individual data sets are indexed within their own archive (e.g., important documents). In this regard, when attempting to reconstruct data associated with a known data set, that data set's archive may be searched rather than searching the entire index of the object store. This allows searching the individual archive instead of searching the global index for desired information. This reduces storage requirements for index, computation requirements for searching, as well as core memory requirements.

Each time a data set is moved into the system, the current state of that data set or a point-in-time catalog is created and is recorded within the system. As may be appreciated, this may only entail storing information (e.g., metadata) associated with the data set as opposed to storing the raw data of the data set (e.g., assuming that data already exists within the system). In any case, the point in time that the data set is stored within the system will be saved. This results in the generation of a point in time catalog (e.g., the Archived UTC entries of FIG. 6). Each catalog, which represents a data set for a particular point in time, contains an exact representation of all the metadata for a particular dataset. However, not all the raw data associated with the data set for a particular point in time has to be copied. Only files that have changed between a previous point in time and the current point in time are copied into the system as previously described above. For files that have not changed, the metadata for the point in time catalog may be stored with appropriate references to data of previous catalogs.

As not all information a point in time need be stored, numerous catalogs may be generated and saved for numerous points in time. That is, rather that a system that provides, for example, a limited number of complete back-up sets of data (e.g., which periodically are replaced by newer back-up data sets) and each of which contains redundant copies of common data, the use of the comparatively small catalogs allows for increasing the amount of points in time for which data may be reconstructed. That is, the catalogs allow for greatly increasing the granularity of the back up data sets that are available to a user.

That is, rather than saving data for each point in time, the catalogs save codes for recreating data for a given point in time. Specifically, a catalog for a point in time contains one or more hash codes for each record (file), which is used by the virtual file system to recreate a replica of the data set for given point in time. Below is an exemplary sample of a single record in the catalog, where the entries for ca, sa, oa, ba, and aa are hash codes representing different streams of data. For instance, <ca> is the VRef for the record and incorporates all the metadata used to identify a particular version. <sa> is a Blob address (hash) to a security stream. <oa> is the Blob address to an optional object identified stream. <ba> is the primary Blob address. <aa> is the alternate (or secondary) blob address.

```
<ref ty="2" nm="build.properties.sample" in="\LittleTest"
on="3162645303" ct="128105391287968750"
at="128186364571718750" mt="127483060790000000"
sz="1644" fl="128" id="5629499534488294"
ca="1d1649cb2b39816d69964c1c95a4a6ad79a41687"
sa="3af4ec95818bdc06a6f105123c2737be6ea288df" oa=" "
ba="01154943b7a6ee0e1b3db1ddf0996e924b60321d" aa=" " op="1" />
```

As shown, this portion of the catalog forms a record that allows for locating and recreating the meta-data and content of a given file.

Referring again to FIG. 6, the catalog represents the original data set and is in a hierarchal form that may include volumes, folders and files. Each of the entries in the hierarchy includes metadata that described their properties. Further, folder records and file records include Vref addresses and archive time stamps. The hierarchy mimics the hierarchy of the data set that is backed up. For instance, the hierarchy may include individual users. For a particular user is selected, for example Mike, the contents of that user's computer, server, etc., may be stored in a manner that is identical to that user's computer, server, etc.

This hierarchy is presented as a portion of the virtual file system (VFS), which as noted above may be used to remotely access any set of stored data and has application outside of the archiving system described herein. The user may access the VFS hierarchy to reconstruct data from the appropriate archive of the object store. In this regard, the user may on their screen see a representation as illustrated in FIG. 6. A user may navigate the VFS to a particular archive and select a desired point-in-time catalog to expand that folder. At that time, the hierarchy beneath that point-in-time catalog may be provided to allow the user to navigate to a desired document within that point-in-time catalog. That is, the user may navigate the VFS, which mimics the user's standard storage interface, until they locate the desired document they want to reconstruct. Of note, no particular point-in-time need be selected by the user. For instance, a search engine may have the ability to search each point in time archive for desired data therein. Importantly, no specialized client application is required to access the VFS. In this regard, the authorized user may utilize their standard operating systems in order to access the archived datasets as would access the desired file on their own computer.

As noted, FIG. 6 is a representation of archived data. In this case, the data is from a Windows file system where multiple archiving runs are keeping full viewable versions of the file system available to a user. Of note, a transition in the VFS occurs in the VFS hierarchy where the archiving point-in-time hierarchy stops and the representation of the data from the source starts. In this example, the transition or pivot is named "Archived UTC-2006.04.03-23.57.01.125". The folder(s) below this point in the hierarchy represent root file systems specified as file/folder criteria for an archiving task. "Users (U$) on 'voyager'" is a file volume with a label Users, a drive letter U and from a system named voyager. However, it will be appreciated that other file systems (e.g., non-Window systems) may also be represented. Once a file level is reached within the archive for a particular point-in-time, the user may select a particular file. This selection then provides a version reference address (Vref), and archive time may be utilized to begin reconstruction of that particular file.

The importance of storing the Blob address with the Vref is that it allows the Vref to reference the actual content within the object store 5, regardless of whether it is a Blob or a delta Blob. In the case where it is a delta Blob, that delta Blob may further reference a baseline Blob. Accordingly, the information may be obtained in an attempt to reconstruct the desired data. At this point, the baseline Blob and, if in existence, a delta Blob have been identified; the data may be reconstructed at this point.

A user may specify the archive time 32 in order to reconstruct data (e.g., for a specific Vref) from a particular time period. As will be appreciated, the actual archive times may not be identical to the desired time period provided by a user. In any case, the system determines 34 the most relevant reconstruction time (e.g. data from a back up performed before or shortly after the desired time). An initial determination 36 is made as to whether the initial Vref has a delta Blob. If a delta Blob exists for the Vref, that delta Blob is obtained 38 from the object store. The corresponding baseline Blob is also obtained 40 from the object store. If there is no delta Blob, only the baseline Blob is obtained. If a Vref references a non-compressed object (e.g. an individual file), that non-compressed object may be obtained for subsequent reading 44.

Once the Blob(s) (or a non-compressed object) are obtained, they may be reconstructed to generate an output of the uncompressed data. See FIG. 8. In the present process, the Vrefs (i.e., which references delta or baseline Blobs) are reconstructed in individual chunks or buffers from the obtained Blobs. The length of such buffers may be of a fixed length or of a variable length, which may be user specified. In the instance where the Vref references a delta Blob, which has been obtained as discussed above, the delta Blob may then be decompressed to reconstruct the Vref data. The object (e.g., delta Blob) is read 52 and decompressed until the buffer 54 is filled. This may be repeated iteratively until the entire object is decompressed. For each decompression of a delta Blob a portion of the delta Blob may require a referenced portion of the baseline to fill the buffer. In this regard, a determination 56 is made as to whether a new dictionary (i.e., portion of the baseline Blob) is required to provide the decompression information to decompress the particular portion of the delta Blob. That is, if necessary the system will obtain 58 a portion of the opened baseline Blob to precondition 60 the decompression algorithm to decompress 62 the current portion of the delta Blob.

Given the two pieces of data, the Vref address and the archive time, these two pieces of data are taken and utilized to search the object store for an exact Vref and archive time match or for the next earliest Vref archive time. See FIG. 7. For instance, if the desired file to be reconstructed had not been changed since an earlier backup, the Vref address may reference earlier Vref time that represents the actual time that the data for that file was stored. Once resolved to this level, the attributes of the Vref are to be read to determine if it is a delta Vref or a baseline.

If no delta Blob exists but rather only a baseline Blob 64, the process obtains 66 the baseline Blob based on the Vref from the object store and decompresses 68 the baseline Blob to fill the buffer. Once a buffer is filled with decompressed data, this buffer of data is returned to the requesting user. In one arrangement, the object may be non-compressed data. In this instance, a data set may exist in a non-compressed form. In such instances, the buffer may be filled 70 without requiring a decompression step. The filling and returning of buffers may be repeated until, for instance, an end of a file is reached. It will be appreciated that multiple files (e.g., multiple Vrefs) from a data set may be retrieved. Further, an entire data set may be retrieved.

Figure 9:
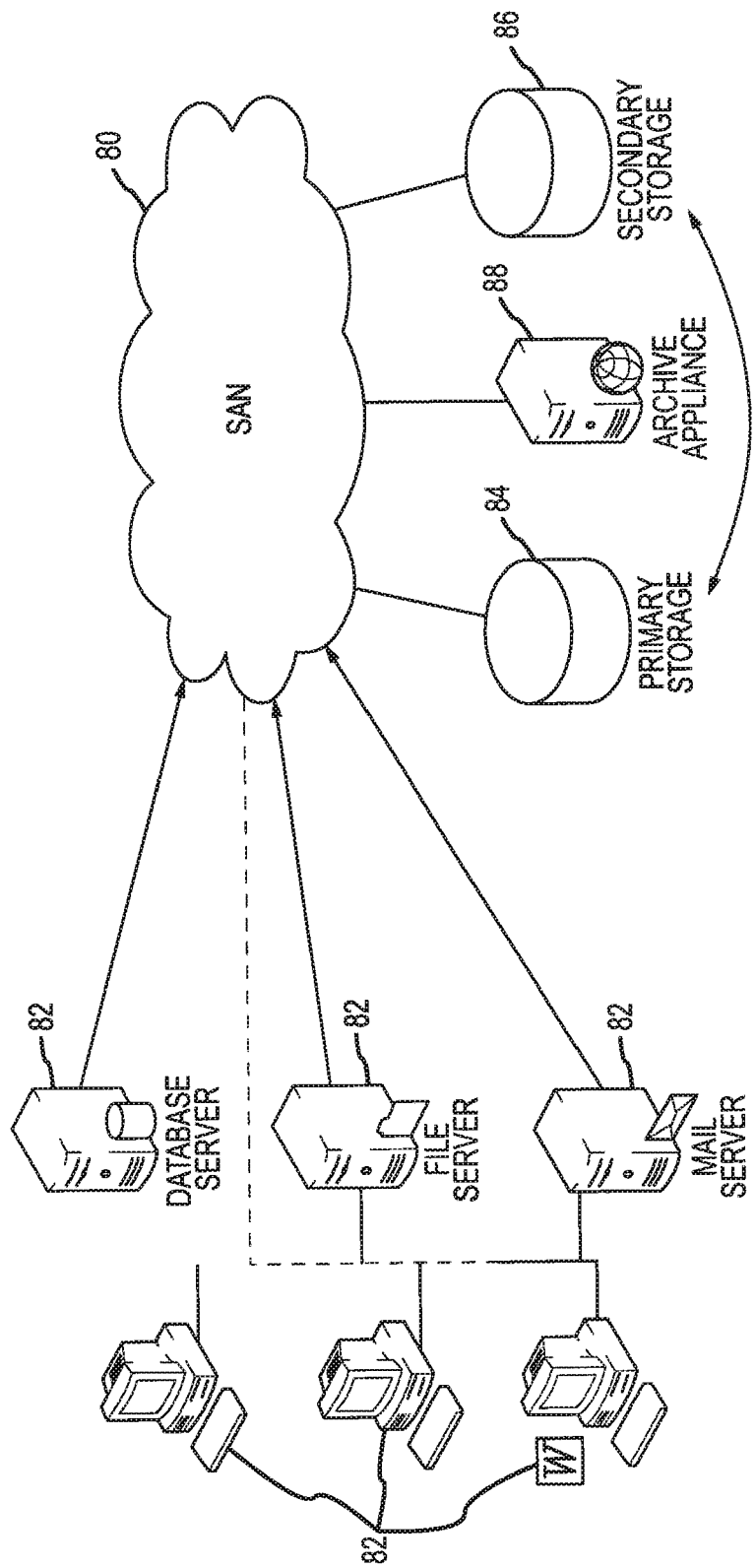
FIG. 9 illustrates storage of data over a network.

One application for the adaptive content factoring technique is to harvest information from traditional disk based backups. In most cases, significant quantities of information are common between two full backup data sets. By factoring out the common data, the effective capacity of a given storage device can be significantly increased without loss of functionality and with increased performance of the archiving system. This makes long term disk-based archiving economically feasible. Such archiving may be performed locally or over a network. See for example FIG. 9. As will be appreciated by those skilled in the art, as network bandwidth decreases it is advantageous to identify the common content of a given dataset and only send changes from a remote server to a central archives In this regard the novel approach described above works exceptionally well given the index used to determine if content is already stored can be efficiently stored and distributed across the network 80. By creating and maintaining content indexes specific to a given data set or like data sets, the corresponding size of the index is reduced to localized content. For example, if an entry in the index is 8 bytes per item, and data set contains 50,000 items. The corresponding size of the index is only 400,000 bytes. This is in contrast of other systems that use monolithic indexes to millions of discrete items archived. As such the smaller distributed index may be stored locally or in the network. In some cases it may be preferable to store the index locally. If the index is stored within the network, by its small size, it can be efficiently loaded into the local program memory to facilitate local content factoring.

Figure 10:
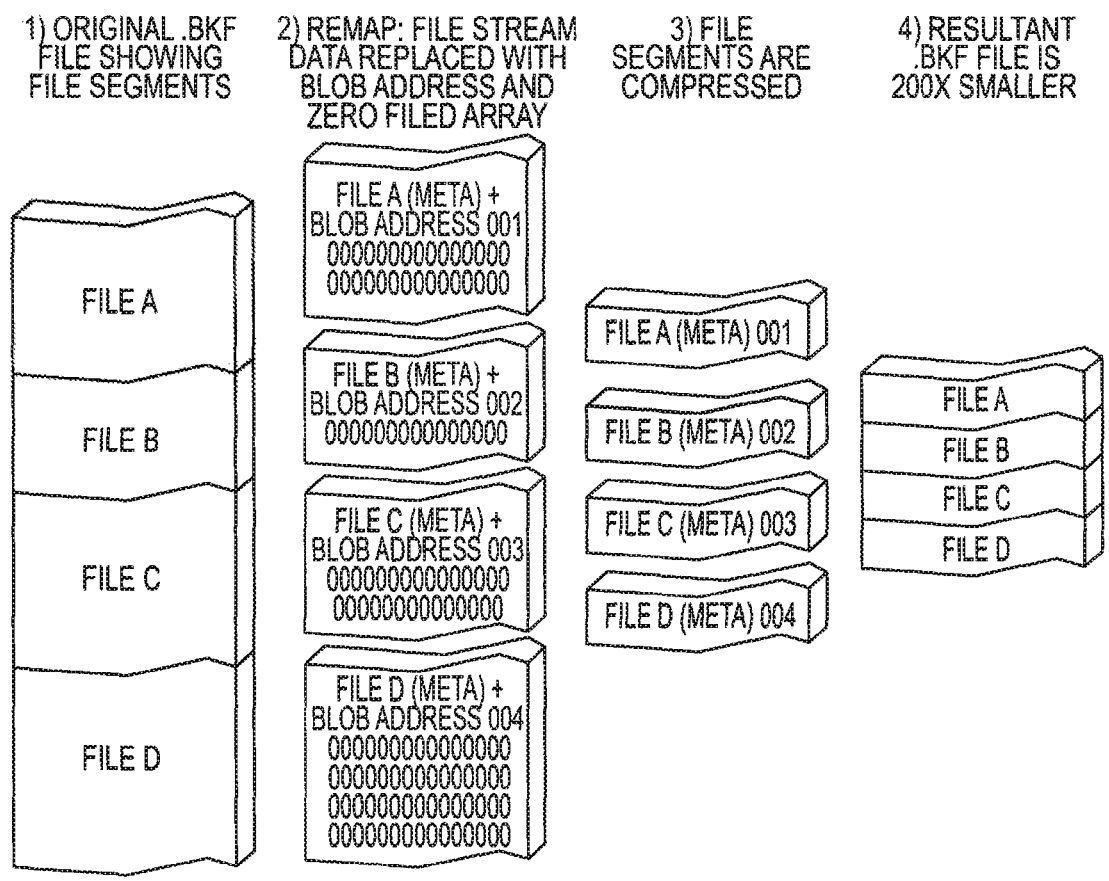
FIG. 10 illustrates one embodiment of storing meta-data with content data.

The techniques described provide for a locally cacheable network of indexes to common content. That is, multiple servers/computers 82 may share a common storage facility 84. This content may be processed by an archiving appliance 88 such that common content is shared to reduce storage requirements. The necessary catalogs may be stored at the common storage facility 84 or at a secondary storage 86. To allow backing up the individual servers/computers, the present technique uses a distributed index per data set. That is, specific sets of identifier and content hashes may be provided to specific server/computers. Generally, the information within the index corresponds to a hash (e.g., a Vref) to a given item within the data set. However, as will be appreciated it is also desirable to store highly referenced content or Blob indices, such as file or object security information that may be common to items within a dataset of between different data sets even if the data sets correspond to items from different host systems to quickly identify that these Blobs have already been stored. In this regard the present technique uses an alternate index to Blobs by replacing the original data set content with a series of Blob addresses followed by a zero filled array of bytes. The Blob address plus zero filled array is such that it exactly matches the logical size of each segment of the original content. As will be appreciated by one skilled in the art the zero filled array is highly compressible by any number of data compression algorithms. The present invention works with any known file format by first dividing the data set into discrete object data streams, replacing each object data stream with a stream address to the content (or Blob) that was previously or concurrently archived using the M3 or similar process described below, then filling the remainder of the remapped data stream with zero. Finally, the remapped stream is compressed, which essentially removes redundancy in the zero filled array. It is desirable for resultant file to be indistinguishable from the original except for the remapping of data stream content. In this regard, a bit-flag may be used within the original file meta data to indicate that the stream data has been replaced to allow the original program that created the original data set to determine that the data stream has been remapped. The present invention sets a reserved flag in a stream header without regard to the header checksum. The originating program can catalog the data set, but when the data stream is read the checksum is checked. Because the reserved flag is set, the checksum test will fail preventing the application from inadvertently reading the remapped stream. FIG. 10 depicts the process. The determination of the stream address may employ the full process using metadata stored internal to the data set and include a reverse lookup to determine the stream Blob address, or use a hash algorithm on the stream data to compute the unique stream Blob address. The unmap process simply reverses the order of operations such that for each Blob address and zero filled array is replaced with the original content and the reserved flag is unset. The result of the unmap reconstruction process is an identical copy of the original data set.

The foregoing description has been presented for purposes of illustration and description. Furthermore, the description is not intended to limit the invention to the form disclosed herein. While a number of exemplary aspects and embodiments have been discussed above, those of skill in the art will recognize certain variations, modifications, permutations, additions, and sub-combinations thereof. It is therefore intended that the following appended claims and claims hereafter introduced are interpreted to include all such variations, modifications, permutations, additions, and sub-combinations as are within their true spirit and scope.

What is claimed is:

1. A computer implemented method for storing data comprising:
   receiving a file;
   hashing a first set of meta-data file properties of the file to generate an identification hash and attempting to match the identification hash to stored identification hashes of previously stored files;
   upon failing to match said identification hash, hashing of a second set of meta-data file properties of the file to generate a secondary hash and attempting to correlate the secondary hash to stored secondary hashes of previously stored files, wherein said first and second sets of meta-data file properties are different;
   upon determining that the secondary hash correlates to a secondary hash of a previously stored file, obtaining content of the previously stored file;
   buffering the content of the previously stored file into a first series of data portions;
   buffering the content of the file into a second series of-like-sized data portions;
   preloading a dictionary-based compression engine with one of the first series of data portions of the previously stored file, wherein the one data portion of the previously stored file as loaded in the dictionary-based compression engine is uncompressed and defines an individual dictionary block;
   compressing a corresponding one of said second series of like-sized data portions of the file using the dictionary-based compression engine as loaded with the data portion of the previously stored file as a dictionary, wherein a compressed data portion is generated and wherein said compressed data portion references the individual dictionary block utilized to generate said compressed data portion; and
   repeating said preloading and compressing steps for each of said first series of data portions to generate a series of compressed data portions; and
   storing said series of compressed data portions to define a compressed version of the file.

2. The method of claim 1, further comprising:
   decompressing the content of the previously stored file prior to buffering the file and preloading the compression engine.

3. The method of claim 1, wherein hashing a second set of meta-data file properties comprises:
   hashing a sub-portion of the meta-data of the file to generate the secondary hash.

4. The method of claim 3, further comprising:
   determining said secondary hash corresponds with a file location of a previously stored file.

5. The method of claim 4, wherein said previously stored file is a prior version of the file.

6. The method of claim 1, further comprising:
   hashing the content of the file to generate a content hash for the file.

7. The method of claim 6, further comprising:
   correlating said content hash to content hashes of previously stored files.

* * * * *

UNITED STATES PATENT AND TRADEMARK OFFICE
CERTIFICATE OF CORRECTION

| | |
|---|---|
| PATENT NO. | : 7,860,843 B2 |
| APPLICATION NO. | : 11/733086 |
| DATED | : December 28, 2010 |
| INVENTOR(S) | : Dodd et al. |

It is certified that error appears in the above-identified patent and that said Letters Patent is hereby corrected as shown below:

Column 5, line 45, delete "theses" and insert therefor --these--.
Column 9, line 60, delete "form" and insert therefor --from--.

Signed and Sealed this
First Day of March, 2011

David J. Kappos
*Director of the United States Patent and Trademark Office*